United States Patent [19]
Reyes

[11] Patent Number: 5,559,359
[45] Date of Patent: Sep. 24, 1996

[54] MICROWAVE INTEGRATED CIRCUIT PASSIVE ELEMENT STRUCTURE AND METHOD FOR REDUCING SIGNAL PROPAGATION LOSSES

[76] Inventor: Adolfo C. Reyes, 866 W. Saint Andrews Blvd., #1084., Chandler, Ariz. 85224

[21] Appl. No.: 367,664

[22] Filed: Jan. 3, 1995

Related U.S. Application Data

[63] Continuation-in-part of Ser. No. 282,444, Jul. 29, 1994, abandoned.

[51] Int. Cl.$^6$ .................................................. H01L 31/00
[52] U.S. Cl. .................... 257/453; 257/277; 257/482; 257/523; 257/532; 257/614; 257/622; 257/655
[58] Field of Search ................................... 257/655, 622, 257/614, 523, 453, 277, 482, 532

[56] References Cited

U.S. PATENT DOCUMENTS

| | | | |
|---|---|---|---|
| 4,030,943 | 6/1977 | Lee | 257/655 |
| 4,731,695 | 3/1988 | Brown et al. . | |
| 5,063,177 | 11/1991 | Geller et al. . | |
| 5,208,726 | 5/1993 | Apel . | |
| 5,227,323 | 7/1993 | Nishitsuji et al. . | |
| 5,267,020 | 11/1993 | Marsland et al. | 257/52 |

OTHER PUBLICATIONS

B. Viktora, "Uber Die Zeitliche Stabilitat Von Getempertem, Reinem Silizium", Solid–State Electronics, vol. 12, pp. 349–362 (Pergamon Press 1969). Jan.

Reyes et al., "Silicon as a Microwave Substrate", Microwave Theory and Techniques Symposium Digest, vol. 3, May 23–27, 1994, pp. 1759–1762.

*Primary Examiner*—Edward Wojciechowicz
*Attorney, Agent, or Firm*—Bruce T. Neel

[57] ABSTRACT

A passive element structure and method for a microwave integrated circuit reduces signal propagation losses. In one approach, a passive element (10) has an insulating layer (12) overlying a silicon substrate (14). A metal layer (16) comprising a signal line (18) and a groundplane (20) is disposed overlying the insulating layer (12), and at least a portion of the metal layer (16) contacts the substrate (14) through at least one opening (22, 24) in the insulating layer (12). The silicon substrate (14) has a resistivity greater than 2,000 ohm-cm, and the passive element (10) preferably carries signals having frequencies greater than 500 MHz. Signal losses in the passive element (10) are minimized because the charge density at the surface (15) of the substrate (14) underlying the metal layer (16) is significantly reduced. In one example, the passive element (10) is a coplanar waveguide transmission line.

25 Claims, 4 Drawing Sheets

5,559,359

MICROWAVE INTEGRATED CIRCUIT PASSIVE ELEMENT STRUCTURE AND METHOD FOR REDUCING SIGNAL PROPAGATION LOSSES

This application is a continuation-in-part of prior application Ser. No. 08/282,444, filed Jul. 29, 1994 now abandoned.

BACKGROUND OF THE INVENTION

The present invention relates, in general, to high frequency circuits and, more particularly, to passive elements of microwave integrated circuits.

Prior high-performance monolithic microwave integrated circuits (MMICs) have been formed on GaAs substrates in order to minimize signal propagation losses. Standard silicon substrates, although generally lower in cost to purchase, handle, and process than GaAs substrates, have not been used as high-performance substrates for MMICs because it has previously been believed that silicon is an unsuitable material for a such a circuit (which typically carries signals with frequencies greater than 500 MHz). Specifically, the lower resistivity of silicon relative to GaAs has been perceived as a significant disadvantage of the use of a silicon substrate. However, a MMIC that could use a silicon substrate would significantly reduce wafer and processing costs. Accordingly, it is desirable to have a MMIC that uses a silicon substrate, yet limits signal propagation losses to levels comparable to that attained with existing MMICs using GaAs substrates.

DETAILED DESCRIPTION OF THE DRAWINGS

Briefly stated, the present invention provides a passive element structure and method for reducing signal propagation losses in a microwave integrated circuit. The present invention generally achieves this by reducing charge density at the surface of the substrate underlying the passive element. Such charge reduction may be accomplished as described in the following embodiments.

Figure 1:
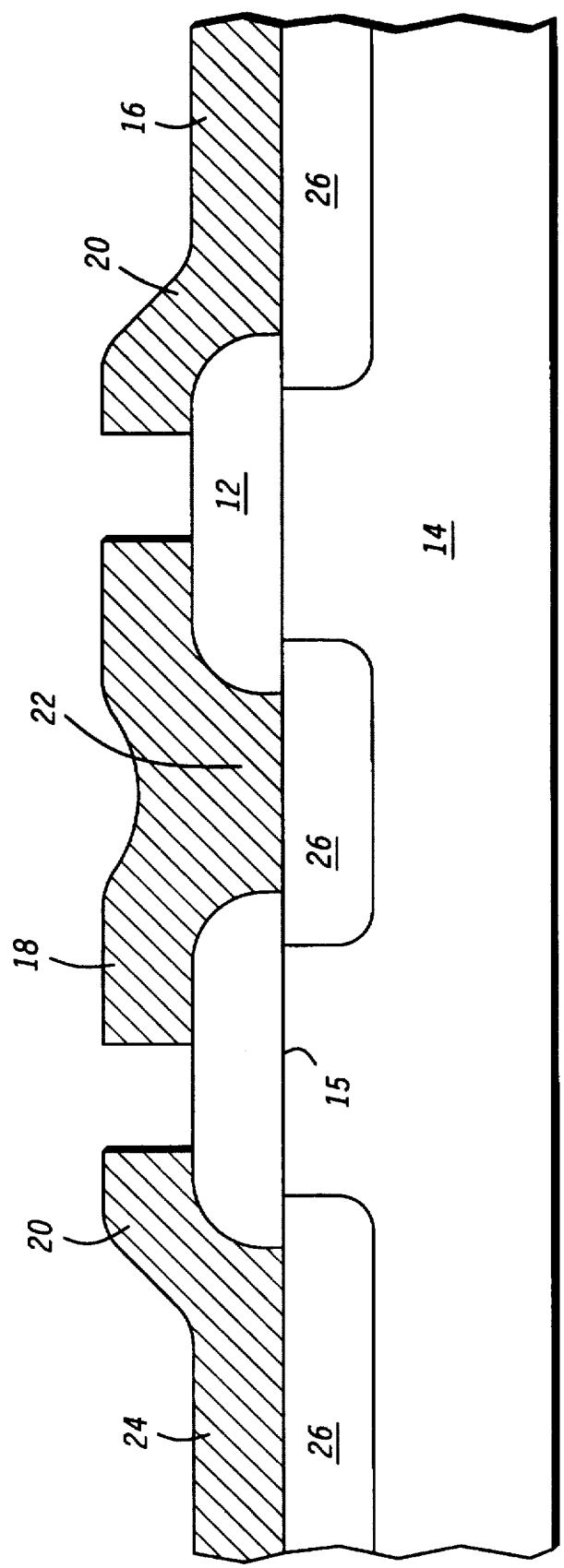
FIG. 1 illustrates a cross-section of a passive element in a microwave integrated circuit according to a first embodiment of the present invention.

The present invention can be more fully described with reference to FIGS. 1–4. FIG. 1 illustrates a cross-section of a passive element 10 according to a first embodiment of the present invention. An insulating layer 12 is disposed on a silicon substrate 14 having a surface 15, and a metal layer 16 is disposed on insulating layer 12. Metal layer 16 is patterned into a signal line 18 and groundplanes 20, such as found, for example, in a coplanar waveguide transmission line. Insulating layer 12 has a first opening 22 and a second opening 24, which are, for example, filled by vias. Signal line 18 and groundplanes 20 form Schottky contacts with substrate 14 through first opening 22 and second opening 24. As a result of this contact, depletion regions 26 are formed.

According to the present invention, passive element 10 has at least a portion of metal layer 16 in contact with substrate 14 to form at least one of depletion regions 26. Accumulation or inversion of charges will occur at surface 15 of substrate 14 anywhere that metal layer 16 is overlying surface 15. However, these charges are not present in depletion regions 26. The formation of inversion or accumulation charges at surface 15 occurs because of the difference in energy levels between metal layer 16 and substrate 14. The presence of these charges at surface 15 is undesirable because it lowers the resistivity of substrate 14 at surface 15 in regions proximate to metal layer 16. This reduced resistivity increases the propagation loss of a signal carried by signal line 18. Charge accumulation or inversion underneath groundplanes 20 also contributes to this propagation loss.

Prior passive elements, where the substrate has surface charges as above, suffer from propagation losses at high frequencies because the propagating signal is no longer carried inside its conductor, but instead travels through the medium in which it is propagating in the form of electromagnetic fields. In general, the medium of propagation comprises one or more conductors and corresponding groundplanes. These groundplanes direct the propagation of the electromagnetic fields, and thus how they travel through the semiconductor material surrounding the medium of propagation. When the semiconductor materials have conducting charges as described above, the signal is attenuated.

According to the present invention, however, the undesirable charges discussed above are substantially depleted from surface 15 due to the presence of depletion regions 26, and thus, propagation loss is significantly reduced. This depletion occurs because surface 15 is depleted of carriers where it is brought into contact with metal layer 16. Due to this depletion, the resistivity of depletion regions 26 is significantly greater than the bulk resistivity of substrate 14. More specifically, the resistivity of depleted regions 26 is substantially equal to the intrinsic resistivity of substrate 14. It should be appreciated that the intrinsic resistivity is the highest attainable resistivity for a particular semiconductor chosen for use. For example, this maximum, intrinsic resistivity is about 100,000 ohm-cm for silicon.

The width of depletion regions 26 is a function of the bulk resistivity of substrate 14. For example, in the case of a 2,000 ohm-cm N-type Si substrate with a built-in voltage between metal layer 16 and substrate 14 of 0.6 V, depletion widths of 20 micrometers are achieved.

An advantage of the present invention with respect to signal propagation is that the bulk of the electromagnetic fields for coplanar-type structures such as that shown in FIG. 1 are concentrated within the first few tens of microns from surface 15. Therefore, the bulk of the electromagnetic fields travel substantially in a semi-insulating environment near the surface that is depleted of charges.

In forming the integrated circuit layout (not shown) for passive element 10, it is generally preferable to establish contact between metal layer 16 and substrate 14 wherever possible in the layout. However, even if only a small portion of metal layer 16 is in contact with substrate 14, some beneficial reduction in signal propagation loss will be observed. It has been found through experimental measurements that providing openings in insulating layer 12, such as first opening 22, wherever possible, except as limited by applicable circuit design rules, provides a microwave integrated circuit that reduces signal propagation losses substantially to levels achieved in prior high-performance MMICs using a GaAs substrate. For example, in one case measured losses have ranged from about 85 dB/m where no openings were used to about 8.5 dB/m where an infinite opening was provided (i.e. an opening under the full extent of the signal line).

Also, in other implementations, contact between metal layer 16 and substrate 14 may be accomplished by one or more vias filled with a conducting material different from that used in metal layer 16. In other words, the metal used to fill the vias may be different than that used for metal layer 16.

The structure illustrated for passive element 10 is applicable to a wide variety of passive elements that may be used on a microwave integrated circuit. FIG. 1 specifically illustrates a cross-section of a coplanar waveguide transmission line. Other passive elements may include, for example, inductors, capacitors, other types of transmission lines and interconnect lines, resistors, and filters. In operation, passive element 10 may advantageously carry signals having frequencies greater than about 500 MHz, and is even more beneficial for signal frequencies greater than about 1 GHz.

In general, any length of passive line in a MMIC greater than $\frac{1}{16}$ of the signal wavelength being carried is suitable for use with the present invention. With a passive line length over $\frac{1}{16}$ of the signal wavelength, the voltage difference between the input and output of the passive line is no longer negligible, thus resulting in significant parasitic capacitances. This occurs in part because the current and voltage components of the propagating signal no longer travel only inside the conductor.

With respect to the materials that may be used for manufacture, substrate 14 is a high-resistivity silicon substrate and preferably has a bulk resistivity of at least about 2,000 ohm-cm, and more preferably greater than about 3,000 ohm-cm. As an example, a high-resistivity N-type silicon substrate having a (100) or (111) crystal orientation may be used. P-type silicon substrates may also be used. A typical bulk resistivity range for preferred silicon substrates is about 3,000 to 7,000 ohm-cm (the higher the bulk resistivity, the higher the resulting depletion width of depletion regions 26).

In addition to the above, high-resistivity substrate 14 should preferably be formed of a high purity silicon that is uncompensated, which means that no metal atoms have been substituted into the silicon to provide the high-resistivity characteristics. Compensated silicon achieves its high resistivity because compensating metal atoms therein create deep-level impurity traps. Using lower purity, compensated silicon can lead to adverse effects because the compensating metal atoms tend to migrate in the substrate at higher processing temperatures. Such temperatures are required, for example, when forming active devices. Possible adverse effects of this migration include a lowering of bulk resistivity of the substrate and a change in substrate semiconductor type from n-type to p-type, or vice versa.

Although shown here as single layers, it should be noted that insulating layer 12 or metal layer 16 may each be either single or multi-layered. For example, insulating layer 12 may be silicon dioxide and/or silicon nitride. Also, metal layer 16 may be a barrier metal formed of copper and/or gold.

Figure 2:
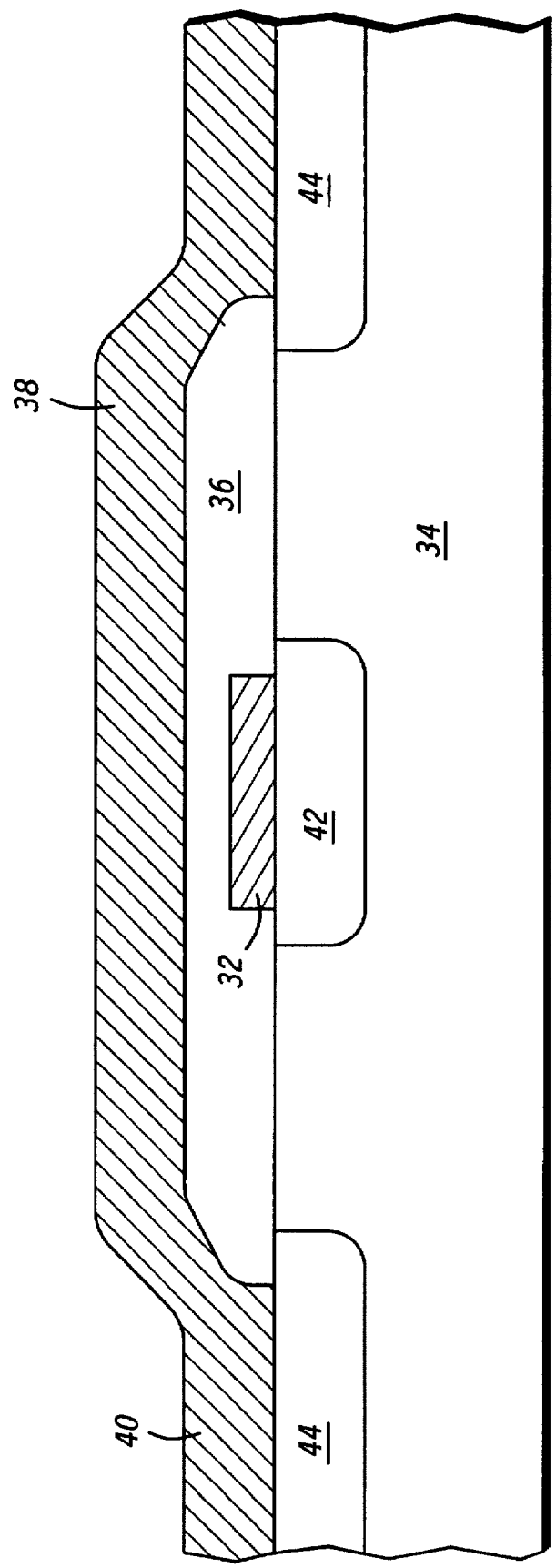
FIG. 2 illustrates a cross-section of a double-level metal passive element according to a second embodiment of the present invention.

FIG. 2 illustrates a cross-section of a double-level metal passive element 30 according to a second embodiment of the present invention. A first metal layer 32 is disposed on a silicon substrate 34, such as, for example, a high resistivity silicon substrate. An insulating layer 36 overlies first metal layer 32 and has an opening 40 therein, and a second metal layer 38 overlies insulating layer 36 and contacts substrate 34 through opening 40. A depletion region 42 is formed where first metal layer 32 contacts substrate 34, and depletion regions 44 are formed where second metal layer 38 contacts substrate 34. As discussed above for FIG. 1, depletion regions 42 and 44 have a high resistivity which reduces propagation loss of a signal carried by passive element 30. Suitable materials for substrate 34 and typical signal frequency operating ranges are similar to that discussed above for FIG. 1.

Passive element 30 of FIG. 2 may also be used to advantage in conjunction with passive element 10 of FIG. 1 to form inductors, to short groundplanes, or to form regions for crossing the metal levels of two-metallization systems. First metal layer 32 may be used to interconnect the center of such an inductor to its output, or to interconnect its groundplanes. Second metal layer 38 is typically used to carry a high frequency signal because it usually has a thicker metallization than first metal layer 32. This results in passive elements (e.g. capacitors, inductors, or transmission lines) having a higher Q value.

Passive element 30 provides a high frequency environment for a double-layer metal system that minimizes propagation loss. The structure shown here maximizes the degree of Schottky contact between first metal layer 32 and substrate 34, and also between second metal layer 38 and substrate 34.

Figure 3:
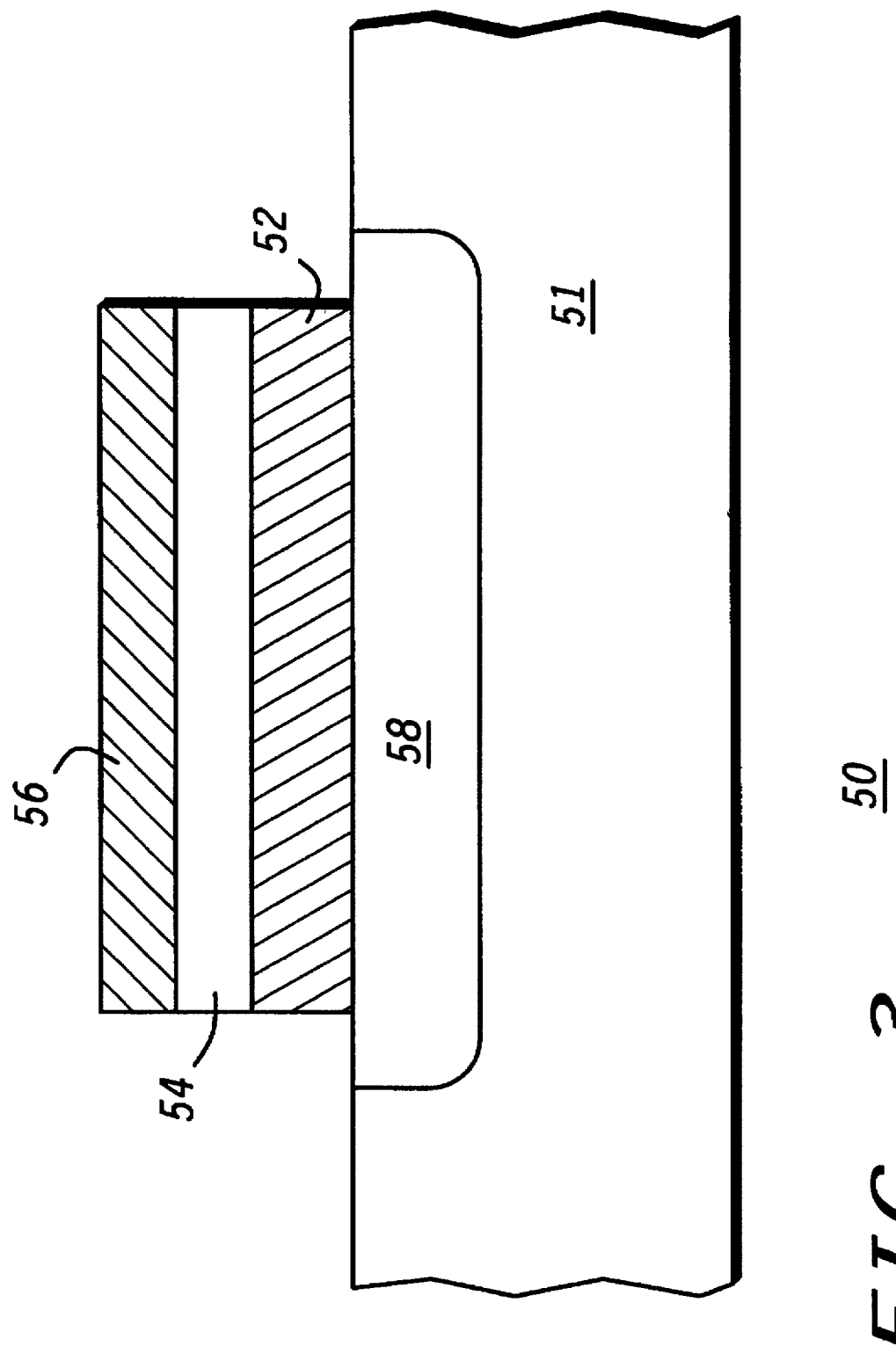
FIG. 3 illustrates a cross-section of a metal-insulator-metal (MIM) capacitor according to a third embodiment of the present invention.

FIG. 3 illustrates a cross-section of an MIM capacitor 50 according to a third embodiment of the present invention. In more detail, a first metal layer 52 is disposed on a substrate 51 and forms a depletion region 58. An insulating layer 54 and a second metal layer 56 are disposed overlying first metal layer 52. Suitable materials for substrate 51 and other elements of capacitor 50, and typical frequency operating ranges are similar to that discussed above for FIGS. 1 and 2.

In FIG. 3, by forming depletion region 58 underneath first metal layer 52, no inversion/accumulation charges are present. Also, depletion region 58 has a very high resistivity. Therefore, there is substantially no signal loss. If an insulator were placed between first metal layer 52 and substrate 51 as in prior MIM capacitors, then an inversion/accumulation region would be formed in substrate 51 producing two undesirable effects: a parasitic capacitor in parallel with MIM capacitor 50, and a low-resistance path which would produce higher signal losses.

Figure 4:
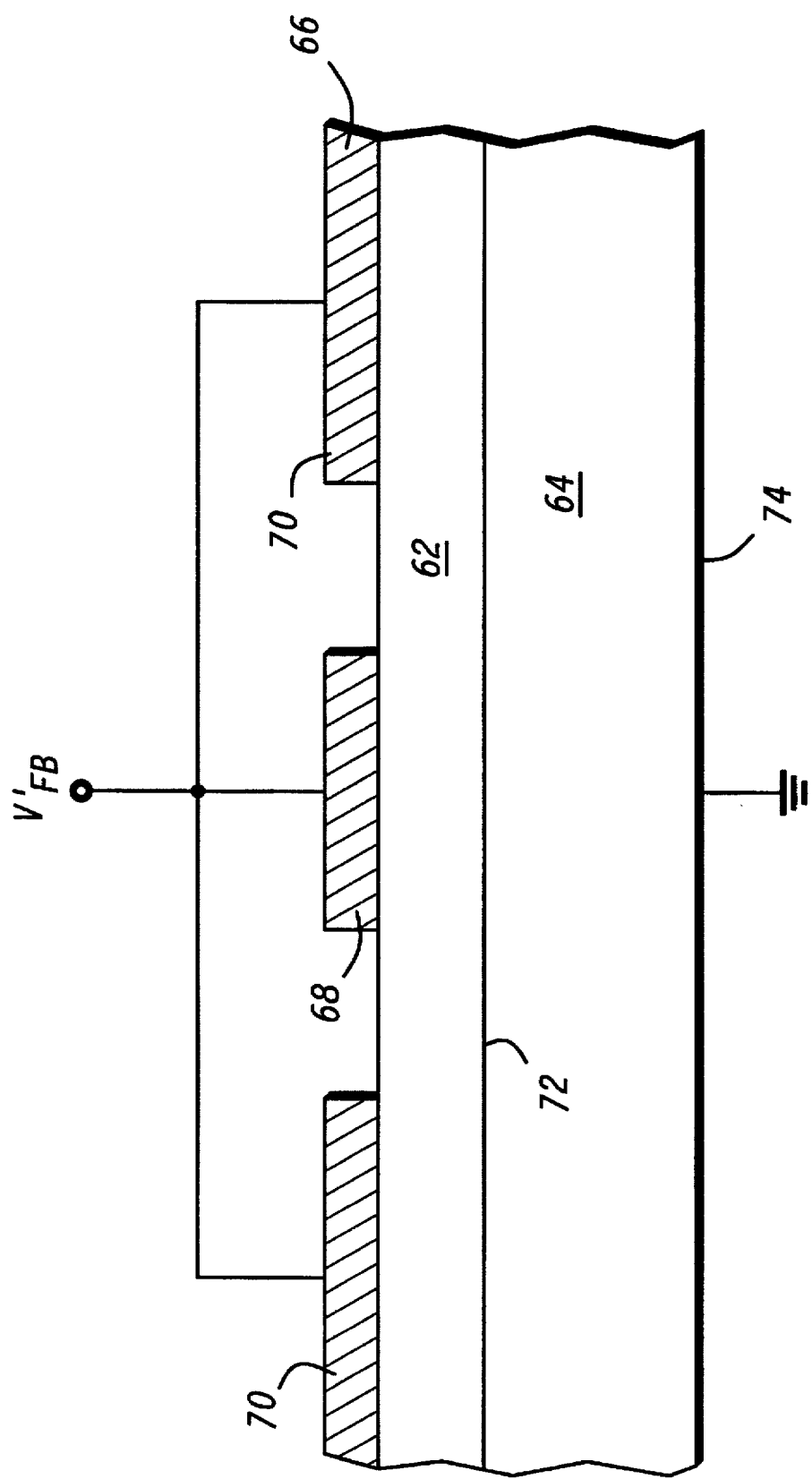
FIG. 4 illustrates a cross-section of a passive element and the application of a flat band voltage thereto according to a fourth embodiment of the present invention.

FIG. 4 illustrates a cross-section of a passive element 60 and the application of a flat band voltage ($V_{FB}$) according to a fourth embodiment of the present invention. An insulating layer 62 is disposed on a substrate 64, which has a surface 72. Substrate 64 is preferably a high-resistivity silicon substrate, but other semiconductor materials may be used for substrate 64 according to this embodiment. A metal layer 66 has been patterned into a signal line 68 and groundplanes 70, such as found in a coplanar waveguide transmission line, and is disposed on insulating layer 62.

As discussed for FIGS. 1–3 above, in the absence of applied voltage $V_{FB}$ an accumulation or inversion region would be formed at surface 72 of substrate 64. The increased charge density in such a region would lower the resistivity of substrate 64 at surface 72 and increase the propagation loss of a signal carried by signal line 68.

According to the present inventions however, $V_{FB}$ is applied across metal layer 66 and surface 72 of substrate 64 so that the resistivity of substrate 64 at surface 72 is substantially equal to the bulk resistivity of substrate 64. This reduces the propagation loss of a high frequency signal carried by signal line 68 by eliminating the inversion/ accumulation charges at the surface. These accumulation/ inversion charges are produced because substrate 64 compensates for the difference in energy levels between metal layer 66 and substrate 64.

The magnitude of $V_{FB}$ applied corresponds to the flat band voltage of the particular metal-insulator-substrate combination selected for use with passive element 60. The flat band voltage depends on many factors including the metal-semiconductor work function difference, fixed charges, mobile charges, interface charges, and the insulator thickness. The fixed charges, mobile charges, and interface charges are located between the semiconductor and the metal. The fixed charges and interface charges are the result of the atomic interface of the semiconductor and the insulator, and the mobile charges are the result of contamination of the insulator during processing. As one skilled in the art knows, the flat band voltage is that voltage for which the valence and conduction bands of substrate 64 are flat at surface 72. The magnitude of the flat band voltage can be determined by measuring the capacitance-versus-voltage characteristics of an appropriate, corresponding metal-insulator-semiconductor capacitor.

In the practice of the present embodiment, a DC voltage source (not shown) applies a voltage $V'_{FB}$ to signal line 68 and groundplanes 70, with a ground reference tied to substrate 64. Substrate 64 is preferably heavily-doped on a back surface 74 to form an ohmic contact with this voltage source. One skilled in the art will recognize that $V'_{FB}$ will need to be somewhat greater than VFB due to the resistive voltage drop across substrate 64, which is preferably a high-resistivity substrate.

Passive element 60 is more advantageous when used for carrying signals having a frequency greater than about 500 MHz, and even more advantageous for frequencies greater than about 1 GHz. When silicon is used for substrate 64, a preferred resistivity is greater than about 2,000 ohm-cm, and a more preferred resistivity is greater than about 3,000 ohm-cm. Passive element 60 may be used in a broad variety of microwave applications including, for example, use as an inductor, a capacitor, a transmission line, a resistor, or a filter.

Additional discussion regarding the use of silicon as a microwave substrate, including results comparing the losses observed for a coplanar transmission line on a silicon substrate to those losses observed on a GaAs substrate, can be found in Reyes et al., "Silicon as a Microwave Substrate," Microwave Theory and Techniques Symposium Digest, vol. 3, May 23–27, 1994, pp. 1759–1762, which is hereby incorporated in full by reference.

By now, it should be appreciated that there has been provided a novel method for reducing signal propagation losses in a microwave integrated circuit. The present invention reduces the high frequency signal losses by creating depletion regions on a high resistivity silicon semiconductor substrate and by eliminating semiconductor surface charges. An advantage of the present invention is that it provides high-performance MMICs on silicon substrates. Silicon processing is a mature technology compared to processing technologies using GaAs, and its use allows the manufacture of low cost MMICs. As one example of the benefits of silicon technology, silicon substrates have excellent planarity for use with many flip-chip bumping and bonding technologies.

I claim:

1. A microwave integrated circuit formed on a silicon substrate and having a passive element for carrying a signal, said passive element comprising:

an insulating layer overlying said substrate and having a first opening; and a metal layer overlying said insulating layer, wherein at least a portion of said metal layer contacts a depletion region in said substrate through said first opening.

2. The circuit of claim 1 wherein said signal has a frequency greater than about 500 MHz.

3. The circuit of claim 1 wherein said signal has a frequency greater than about 1 GHz.

4. The circuit of claim 1 wherein said substrate has a resistivity greater than about 2,000 ohm-cm.

5. The circuit of claim 1 wherein said substrate has a resistivity greater than about 3,000 ohm-cm.

6. The circuit of claim 1 wherein said passive element is a transmission line.

7. The circuit of claim 1 wherein said passive element is a coplanar waveguide transmission line.

8. The circuit of claim 1 wherein:

said metal layer comprises a signal line and a groundplane;

at least a portion of said signal line contacts said substrate through said first opening; and at least a portion of said groundplane contacts said substrate through a second opening in said insulating layer.

9. The circuit of claim 1 wherein said passive element is an inductor, a capacitor, a transmission line, a resistor, or a filter.

10. A microwave integrated circuit formed on a silicon substrate having a resistivity greater than 2,000 ohm-cm and including a passive element for carrying a signal, said signal having a frequency greater than 500 MHz, said passive element comprising:

an insulating layer overlying said substrate and having an opening; and a metal layer overlying said insulating layer, wherein at least a portion of said metal layer contacts a depletion region in said substrate through said opening.

11. The circuit of claim 10 wherein said passive element is a waveguide transmission line.

12. A microwave integrated circuit formed on a silicon substrate and having a passive element for carrying a signal, said passive element comprising:

a first metal layer formed on a first depletion region in said substrate;

an insulating layer overlying said first metal layer and having an opening; and a second metal layer overlying said first metal layer, wherein at least a portion of said second metal layer contacts a second depletion region in said substrate through said opening.

13. The circuit of claim 12 wherein:

said substrate has a resistivity greater than 2,000 ohm-cm; and said signal has a frequency greater than 500 MHz.

14. In a microwave integrated circuit formed on a silicon substrate, a metal-insulator-metal capacitor comprising:

a first metal layer disposed on a depletion region in said substrate;

an insulating layer disposed on said first metal layer; and a second metal layer disposed on said insulating layer.

15. The capacitor of claim 14 wherein a signal applied to said capacitor has a frequency greater than 500 MHz.

16. The capacitor of claim 15 wherein said substrate has a resistivity greater than 2,000 ohm-cm.

17. A method for reducing propagation losses of a signal carried in a microwave integrated circuit formed on a substrate having a surface, wherein said signal has a frequency greater than 500 MHz, comprising the steps of:

providing a passive element for carrying said signal, said passive element comprising an insulating layer disposed on said surface of said substrate, and a metal layer disposed on said insulating layer; and applying a voltage across said metal layer and said surface of said substrate having a magnitude substantially equal to a flat band voltage corresponding to said substrate, said insulating layer, and said metal layer.

18. The method of claim 17 wherein said step of applying a voltage includes selecting said magnitude so that a first resistivity of said substrate at said surface is substantially equal to a second bulk resistivity of said substrate.

19. The method of claim 17 wherein said step of applying a voltage includes selecting said magnitude so that a valence band and a conduction band of said substrate are substantially flat at said surface of said substrate.

20. The method of claim 17 wherein said substrate is silicon.

21. The method of claim 20 wherein said substrate has a resistivity greater than 2,000 ohm-cm.

22. The method of claim 20 wherein said passive element is an inductor, a capacitor, a transmission line, a resistor, or a filter.

23. The method of claim 17 wherein said signal has a frequency greater than 1 GHz.

24. The method of claim 17 wherein said metal layer comprises a signal line and a groundplane, and said voltage is applied to said signal line and said groundplane.

25. A method for reducing propagation losses of a signal carried in a microwave integrated circuit formed on a silicon substrate having a resistivity of greater than 2,000 ohm-cm and having a surface, wherein said signal has a frequency greater than 500 MHz, comprising the steps of:

providing a passive element for carrying said signal, said passive element comprising an insulating layer disposed on said surface of said substrate, and a metal layer disposed on said insulating layer; and applying a voltage across said insulating layer and said surface of said substrate having a magnitude substantially equal to a flat band voltage corresponding to said substrate, said insulating layer, and said metal layer.

* * * * *

UNITED STATES PATENT AND TRADEMARK OFFICE
CERTIFICATE OF CORRECTION

PATENT NO. : 5,559,359
DATED : September 24, 1996
INVENTOR(S) : Adolfo C. Reyes

It is certified that error appears in the above-indentified patent and that said Letters Patent is hereby corrected as shown below:

Claim 15, column 7, line 1, remove "claim 14" and replace with —claim 14—.

Signed and Sealed this

Tenth Day of December, 1996

Attest:

BRUCE LEHMAN

*Attesting Officer*          *Commissioner of Patents and Trademarks*